July 3, 1973 M. W. SCOTT ET AL 3,743,553

PN JUNCTIONS IN MERCURY CADMIUM TELLURIDE

Filed June 18, 1971

INVENTOR.
ARVID E. KLOEK
MYRSYL WALTER SCOTT
BY
Omund R. Dahle
ATTORNEY.

United States Patent Office 3,743,553

Patented July 3, 1973

3,743,553

PN JUNCTIONS IN MERCURY CADMIUM TELLURIDE

Myrsyl Walter Scott, Minnetonka, and Arvid E. Kloek, Minneapolis, Minn., assignors to Honeywell Inc., Minneapolis, Minn.

Filed June 18, 1971, Ser. No. 154,480
Int. Cl. H01l 7/62
U.S. Cl. 148—188 7 Claims

ABSTRACT OF THE DISCLOSURE

PN junctions are formed in an N type body of mercury cadmium telluride by depositing a gold layer on a surface of the N type body and heating the body to diffuse the gold into the body, thereby forming a region of P type conductivity in the N type body.

BACKGROUND OF THE INVENTION

The development of solid state detectors of wavelengths within the infrared portion of the electromagnetic spectrum is led to the use of semiconductor alloys having the proper energy gap for intrinsic photoconductivity at wavelengths within the range of 1.7 to 30 microns. One successful intrinsic detector material that has been developed for the photoconductive detectors is mercury cadmium telluride ($Hg_{1-x}Cd_xTe$), a semiconductor material which is an alloy of a semi-metal, mercury telluride and a semiconductor, cadmium telluride. The mole ratio, $x$, of cadmium telluride in the alloy determines the energy gap and therefore the optical and semiconducting properties of the alloy.

It is highly desirable to form PN junctions in mercury cadmium telluride. This allows the fabrication of detectors operating in the photovoltaic rather than the photoconductive mode of detection.

The electrical properties of mercury cadmium telluride can be altered either by changing the stoichiometry or by foreign impurity doping. Although not a great deal is known about the properties of impurities in mercury cadmium telluride, it is generally assumed that interstitial mercury and cadmium produce N type conductivity while mercury and cadmium vacancies as well as tellurium interstitials produced P type conductivity. In Applied Physics Letters 10, 241 (1967) C. Vérie and J. Ayas suggested the formation of PN junctions in mercury cadmium telluride by the adjustment of stoichiometry.

The formation of PN junctions by diffusion of foreign impurities into mercury cadmium telluride is complicated by two requirements. First, the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $In_2Te_3$, $TeI_2$ and $TeI_4$.

SUMMARY OF THE INVENTION

In the present invention PN junctions are formed in an N type body of mercury cadmium telluride by depositing a layer of gold on a surface of the N type body and heating the body to diffuse the gold into the body, thereby forming a region of P type conductivity in the N type body.

With the present invention, the requirements necessary for successful doping of mercury cadmium telluride with a foreign impurity are met. In addition, gold diffusion has several advantages. First, PN junctions can be formed by gold diffusion into higher $x$ value materials. Second, gold is a very convenient impurity to use since it is easily deposited on mercury cadmium telluride by coating the surface with a gold chloride solution or by electrolytically plating gold on the surface of a body of mercury cadmium telluride.

DESCRIPTION OF THE PREFERRED EMBODIMENTS

In the present invention a PN junction is formed in an N type body of mercury cadmium telluride in the following manner. A gold layer is deposited on the surface of the N type body of mercury cadmium telluride. The body is then heated to diffuse the gold into the body, forming a region of P type conductivity. If the device so formed is to be used as a photovolatic detector, the gold layer remaining on the surface after termination of the heating step is removed.

In one successful embodiment of the present invention polished and etched slices of N type mercury cadmium telluride are coated with gold using a gold chloride solution. The $Au^{+3}$ ions in solution displace mercury and cadmium from the surface of the N type body leaving behind a tellurium rich surface layer and a metallic gold layer. Diffusion is done at a temperature of between about 250° C. and about 400° C. in an atmosphere of flowing hydrogen. When the preferred diffusion temperature of about 300° C. is used, the total heating time of the diffusion step is about 10 to 15 minutes, of which five minutes is required for sample and tube heat-up. After diffusion, a cross hatched pattern is cut in the surface of the body with a wire saw, thereby forming one millimeter by one millimeter squares in the form of mesas. A protective paraffin layer is applied to the mesas and then the cuts formed by the wire saw are cleaned and etched in $Br_2$-alcohol until clean and shiny. The protective paraffin layer on the mesas is then removed to form a contact to the gold layer remaining on the surface of the mesa. In one embodiment, the contact is formed by indium solder which contacts the deposited gold layer. An ohmic contact is also made to the N type region to form a diode.

In another embodiment of the present invention, the formation of the mesas is achieved by etching rather than by sawing. A photoresist such as Shipley photoresist AZ–1350 is applied to the surface of the body to define the mesas. The mesas are then formed by etching with $Br_2$-alcohol. In this embodiment a protective paraffin layer is not required.

In still other embodiments of the present invention the gold layer which is deposited on the surface of the N type body is either electrolytically gold plated or evaporated on the surface rather than deposited by the use of gold chloride solution. All of these techniques are particularly advantageous since the regions of gold doping can be localized without the special masking techniques which are required in vapor phase diffusions.

When the diodes formed by the preferred technique described above are to be used as photovoltaic detectors, the gold layer must be removed after the diffusion step.

This is accomplished by a light polishing lap prior to the formation of mesas.

Figure 1A:
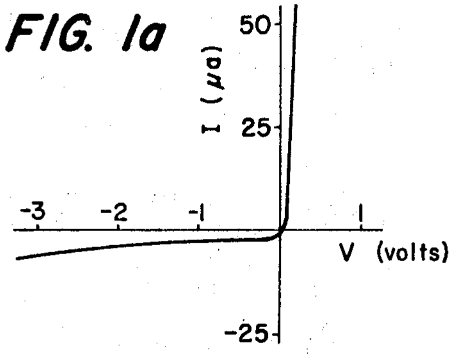
FIG. 1 shows the I–V characteristics of three mercury cadmium telluride diodes formed by the method of the present invention.
Figure 1B:
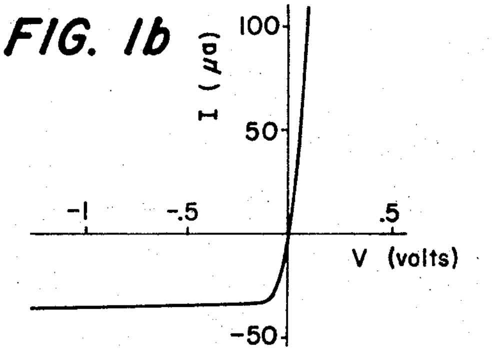
Figures 1C, 2:
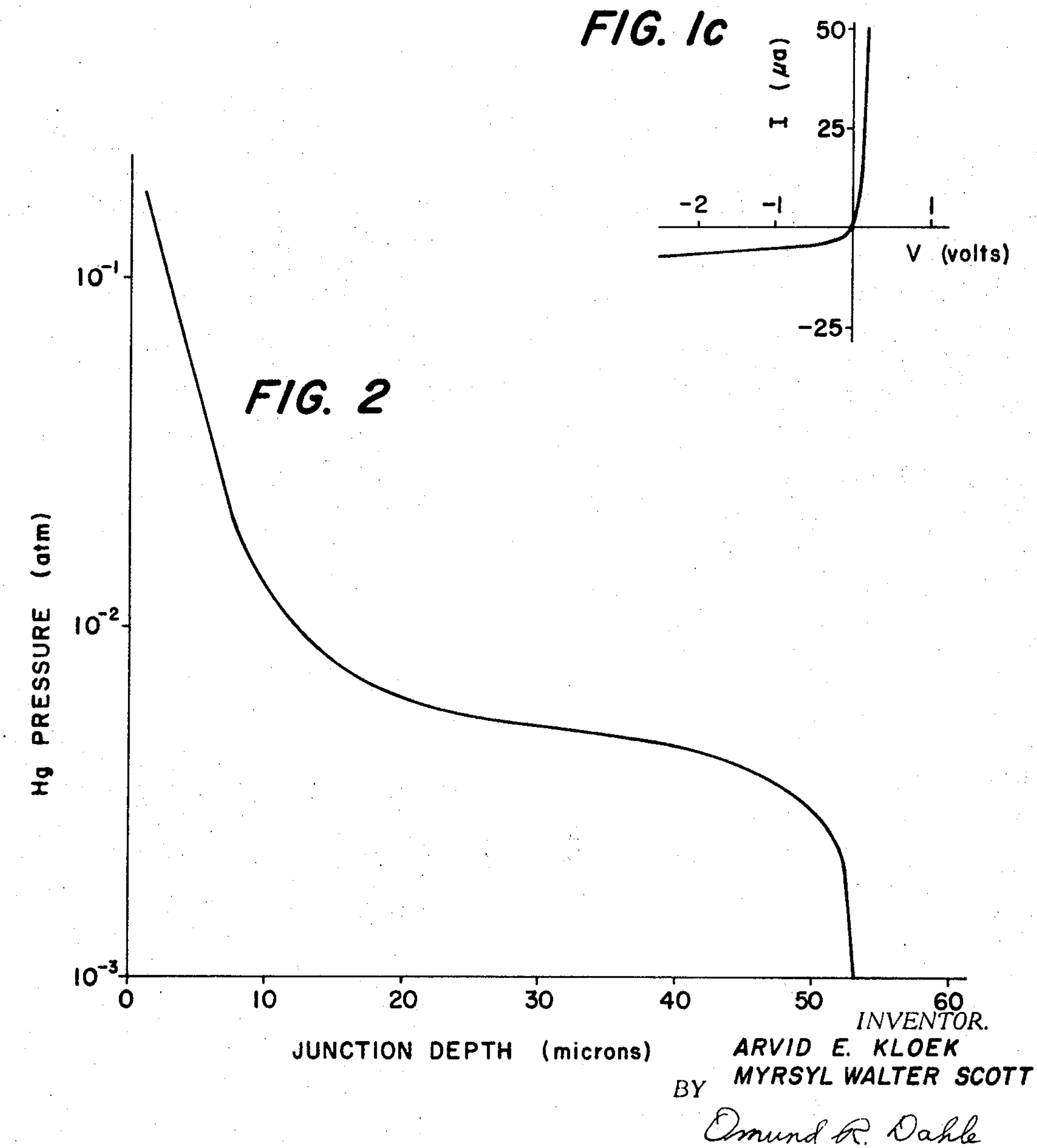
FIG. 2 shows the effect of mercury overpressure on the junction depth of mercury cadmium telluride where $x=0.2$.

FIG. 1 shows the I–V characteristics of three $Hg_{1-x}Cd_xTe$ diodes formed by the method of the present invention. FIG. 1*a* shows the I–V characteristic of a diode formed in $x \approx 0.3$ material which was measured at 77° K. FIG. 1*b* shows the I–V characteristics of a diode formed in $x \approx 0.4$ material measured at 300° K. Similarly the I–V characteristic measured at 300° K. of a diode formed in $x \approx 0.5$ material is shown in FIG. 1*c*.

In order to better understand the physical mechanisms involved in gold diffusion, several experiments were performed. First, the diffusion coefficient of gold in mercury cadmium telluride having a low $x$ value (0.2) was determined. This determination was accomplished by measuring the junction depth for a variety of diffusion times. The junction depth was determined by carefully lapping and thermal probing the surface of the mercury cadmium telluride until the junction was located. The weight change of the body due to lapping was used to determine thickness. This is an approximate method of determining the junction depth, which is limited to an accuracy of about ±10 microns. The diffusion coefficient at 300° C. is estimated to be $10^{-9}$ cm.$^2$/sec. using $5\times10^{17}$/cm.$^3$ as the surface concentration of gold and an error function profile. Although this value is only an order of magnitude estimate, it nevertheless indicates that gold diffuses into mercury cadmium telluride at a very fast rate at a low temperature such as 300° C.

To determine if gold diffuses substitutionally via the normal lattice sites into mercury cadmium telluride a number of experiments were performed.

Experiment 1

A number of samples from the same ingot of mercury cadmium telluride having an $x$ value of 0.2 were plated with gold and heated at 300° C. for 30 minutes with different mercury overpressures. The depth of the PN junction was then measured in each sample. FIG. 1 shows the results of this experiment. At the high mercury pressures there was very little penetration of the gold, whereas at low mercury pressures the junction was approximately 50 microns deep. This indicates that the concentration of mercury vacancies and interstitials in the crystal lattice control the rate of gold diffusion. It is believed that the gold diffuses via normal mercury lattice sites, either through vacancies or by creating a vacancy interstitial pair. The interstitials created by the gold have to diffuse out of the crystal since their normal solubility is only $10^{15}$ to $10^{16}$/cm.$^3$ at these temperatures. By keeping the mercury overpressure high the out-diffusion can be prevented, thereby also limiting the diffusion of the gold into the crystal. This dependence of diffusion rate on mercury overpressure is similar to the interdiffusion of cadmium telluride into mercury telluride, which can be stopped with high mercury overpressures. The diffusion coefficient of gold in mercury cadmium telluride of $10^{-9}$ cm.$^2$/sec. determined above was obtained with no mercury overpressure, and therefore it is the maximum value of diffusion coefficient attainable for compositions having $x=0.2$ and the diffusion temperature of 300° C.

Experiment 2

Long term (10 day) anneals at 300° C. were done on three N type samples of mercury cadmium telluride with mercury overpressures of 0.05, 0.015 and 0.001 atmosphere. The low pressure sample was converted to P type with a carrier concentration of about $5\times10^{17}$ holes/cm.$^3$. The sample showed no decrease in free carrier concentration as a function of temperature, which is commonly termed "freeze-out," down to 4° K. The samples annealed at the higher mercury overpressures had a thin P type skin which was less than 50 microns thick. However, the samples remained N type in their interior portions with approximately the same electron concentration as they exhibited before the annealing. The thin P type layer found on these samples may be due to gold diffusion through the cadmium sub-lattice rather than through the mercury sub-lattice as it does at lower mercury overpressures. Since cadmium telluride has a higher dissociation energy, the rate of displacement of cadmium atoms is quite small at temperatures near 300° C. The samples used in this experiment were electrolytically gold plated rather than plated by gold chloride. This prevents any possible doping from the tellurium rich layer left behind when the gold is plated using gold chloride.

Experiment 3

To insure that it is gold which dopes the sample annealed at 0.001 atmosphere and not mercury vacancies, a number of N type test samples, both with and without gold on the surface were annealed in the same ampoules. After annealing, the gold plated samples exhibited P type conductivity whereas the samples without gold plating remained N type. The equilibrium gold concentration at 300° C. is between $5\times10^{17}$ and $10^{18}$ atoms/cm.$^3$ for both $x=0.2$ and $x=0.3$ compositions of mercury cadmium telluride.

While this invention has been disclosed with particular reference to the preferred embodiments, it will be understood by those skilled in the art that changes in form and details may be made without departing from the spirit and scope of the invention.

The embodiments of the invention in which an exclusive property or right is claimed are defined as follows:

1. A method of forming a PN junction in an N type body of mercury cadmium telluride comprising:

depositing a gold layer on a surface of the N type body, and heating the body to diffuse gold into the body, forming a region of P type conductivity.

2. The method of claim 1 wherein depositing the gold layer comprises coating the surface of the body with a gold chloride solution.

3. The method of claim 1 wherein the body is heated to a temperature of between about 250° C. and about 400° C.

4. The method of claim 3 wherein the body is heated to a temperature of about 300° C. for about 10 to 15 minutes.

5. The method of claim 1 and further comprising removing the gold layer remaining on the surface after termination of heating.

6. The method of claim 1 wherein depositing a gold layer comprises electrolytically plating gold on the surface of the body.

7. The method of claim 1 wherein depositing a gold layer comprises evaporating gold on the surface of the body.

References Cited

UNITED STATES PATENTS

| | | | |
|---|---|---|---|
| 3,013,955 | 12/1961 | Roberts | 204—15 |
| 3,342,651 | 9/1967 | Raithel | 148—188 |
| 3,615,877 | 10/1971 | Yamashita | 148—1.5 |
| 3,617,398 | 11/1971 | Bilous et al. | 148—187 |
| 3,619,283 | 11/1971 | Carpenter et al. | 252—62.3 ZT |
| 3,679,496 | 7/1972 | Te Velde et al. | 148—188 |

OTHER REFERENCES

Tsyutsyura et al., "Preparation and Some Properties of P-N Junctions Based on $Zn_xHg_{1-x}Te$," Soviet Physics-Semiconductors, vol. 4, No. 8, February 1971.

GEORGE T. OZAKI, Primary Examiner

U.S. Cl. X.R.

148—186; 252—62.3 ZT